United States Patent [19]
Sheng et al.

[11] Patent Number: 5,585,297
[45] Date of Patent: Dec. 17, 1996

[54] METHOD OF MANUFACTURE OF MULTI-STATE MASK ROM AND MULTI-STATE MASK ROM DEVICE PRODUCED THEREBY

[75] Inventors: Yi-Chung Sheng, Taichung; Chen-Hui Chung, Hsin-Chu; Kuan-Cheng Su, Taipei, all of Taiwan

[73] Assignee: United Microelectronics Corporation, Hsin-Chu, Taiwan

[21] Appl. No.: 450,298

[22] Filed: May 25, 1995

[51] Int. Cl.$^6$ .............................................. H01L 21/8246
[52] U.S. Cl. ................... 437/52; 437/45; 437/48
[58] Field of Search .................... 437/45, 48, 52; 257/390, 391; 365/178

[56] References Cited

U.S. PATENT DOCUMENTS

| | | | |
|---|---|---|---|
| 4,052,229 | 10/1977 | Pashley | 437/45 |
| 4,356,042 | 10/1982 | Gedaly | 437/45 |
| 5,002,896 | 3/1991 | Naruke | 437/48 |
| 5,200,355 | 4/1993 | Choi et al. | 437/52 |
| 5,275,959 | 1/1994 | Kobayashi | 437/52 |
| 5,278,078 | 11/1994 | Kanebako | 437/52 |
| 5,470,774 | 11/1995 | Kunitou | 437/45 |

*Primary Examiner*—Tom Thomas
*Attorney, Agent, or Firm*—William H. Wright

[57] ABSTRACT

This is a method of manufacturing a multiple state MASK ROM semiconductor device on a P-type semiconductor substrate. The substrate includes an array of parallel buried bit lines oriented in a first direction. The process includes forming a gate oxide layer over the substrate including the buried bit lines; word lines over the gate oxide layer oriented orthogonally to the direction of the array of bit lines. Then form a first patterned implant mask over the device with a first set of openings through the mask. Ion implant dopant of a first dosage level through the openings in the mask to form implant doped regions of a first dosage level in the substrate. Form a second patterned implant mask over the device with a second set of openings through the mask. Then ion implant a dopant of a second dosage level through the openings in the mask to form implanted doped regions of a second dosage level in the substrate, the second dosage level being substantially different from the first dosage level.

15 Claims, 5 Drawing Sheets

METHOD OF MANUFACTURE OF MULTI-STATE MASK ROM AND MULTI-STATE MASK ROM DEVICE PRODUCED THEREBY

BACKGROUND OF THE INVENTION

1. Field of the Invention

This invention relates to semiconductor read only memory devices and more particularly to method of manufacture of a Mask ROM device and the devices produced thereby.

2. Description of Related Art

In a conventional MASK ROM device, there are only two states, which are the "ON" state and the "OFF" state. The "ON" state is defined by code implantation. Typically the "OFF" cell threshold voltage ($V_T$) is above 5 V and the "ON" cell $V_T$ is below 1 Volt. In a high density MASK ROM (32M or 64M), a conventional two state MASK ROM (which has a large chip size) will consume a large wafer area because of that large chip size.

SUMMARY OF THE INVENTION

In accordance with one aspect of this invention a method of manufacturing a ROM semiconductor device formed on a P-type semiconductor substrate, the substrate including an array of parallel buried bit lines integral therewith, the bit lines being oriented in a first direction, comprises the steps as follows:

forming a gate oxide layer over the substrate including the buried bit lines, forming word lines over the gate oxide layer oriented orthogonally to the direction of the array of bit lines, forming a first patterned implant mask over the device with a first set of openings through the mask, ion implanting dopant of a first dosage level through the openings in the mask to form implant doped regions of a first dosage level in the substrate, forming a second patterned implant mask over the device with a second set of openings through the mask, ion implanting a dopant of a second dosage level through the openings in the mask to form implant doped regions of a second dosage level in the substrate, the second dosage level being substantially different from the first dosage level, whereby a multiple state MASK ROM device is provided.

Preferably, the first patterned implant dopant comprises $B^{11}$, $BF_2$ or P-type dopant ions implanted at an energy of from about 120 keV to about 140 keV at a dose of from about $1 \times 10^{14}$ ions/cm$^2$ to about $2 \times 10^{14}$ ions/cm$^2$;

the second patterned implant dopant comprises $B^{11}$, $BF_2$ or P-type dopant ions implanted at an energy of from about 120 keV to about 140 keV at a dose of from about $2 \times 10^{13}$ ions/cm$^2$ to about $8 \times 10^{13}$ ions/cm$^2$;

the first patterned implant provides a dopant concentration from about 1 E 18 atoms/cm$^3$ to about 2 E 18 atoms/cm$^3$;

the second patterned implant provides a dosage concentration from about 1 E 17 atoms/cm$^3$ to about 1 E 18 atoms/cm$^3$;

the first patterned implant dopant comprises boron, $B^{11}$, implanted at an energy of from about 120 keV to about 140 keV at a dose of from about $1 \times 10^{14}$ ions/cm$^2$ to about $2 \times 10^{14}$ ions/cm$^2$, the first patterned implant providing a dopant concentration from about 1 E 18 atoms/cm$^3$ to about 2 E 18 atoms/cm$^3$;

the second patterned implant dopant comprises boron, $B^{11}$, implanted at an energy of from about 120 keV to about 140 keV at a dose of from about $2 \times 10^{13}$ ions/cm$^2$ to about $8 \times 10^{13}$ ions/cm$^2$, the first patterned implant providing a dopant concentration from about 1 E 17 atoms/cm$^3$ to about 1 E 18 atoms/cm$^3$; and the buried bit lines comprise N+ regions in the substrate.

In accordance with another aspect of this invention, a ROM semiconductor device formed on a silicon substrate having a lightly doped dosage level comprises:

an array of parallel bit lines integral therewith, the bit lines being oriented in a first direction, a gate oxide layer over the substrate including the buried bit lines, a parallel array of word line conductors formed over the device oriented orthogonally relative to the bit lines, a first set of regions in the substrate between the buried bit lines implanted with a first patterned implant dopant of a first dosage level, a second set of regions in the substrate between the buried bit lines implanted with a second patterned implant dopant of a second dosage level substantially different from the first dosage level and different from the lightly doped dosage level of the substrate, whereby a multiple state MASK ROM device is provided.

Preferably, the first implant dopant level comprises boron, $B^{11}$, implanted with a dose of from about $1 \times 10^{14}$ ions/cm$^2$ to about $2 \times 10^{14}$ ions/cm$^2$;

the second implant dopant comprises boron, $B^{11}$, implanted with a dose of from about $2 \times 10^{13}$ ions/cm$^2$ to about $8 \times 10^{13}$ ions/cm$^2$;

the word line conductive layer consists of a material selected from polysilicon and polycide;

the word line conductive layer has a thickness within a range of from about 2,000 Å to 4,000 Å;

the first patterned implant dopant comprises boron, $B^{11}$, with a dose of from about $1 \times 10^{14}$ ions/cm$^2$ to about $2 \times 10^{14}$ ions/cm$^2$;

the second patterned implant dopant comprises $B^{11}$, $BF_2$ or P-type dopant ions implanted at an energy of from about 120 keV to about 140 keV at a dose of from about $2 \times 10^{13}$ ions/cm$^2$ to about $8 \times 10^{13}$ ions/cm$^2$;

the first patterned implant providing a dopant concentration from about 1 E 18 atoms/cm$^3$ to about 2 E 18 atoms/cm$^3$; and the second patterned implant providing a dosage concentration from about 1 E 17 atoms/cm$^3$ to about 1 E 18 atoms/cm$^3$.

BRIEF DESCRIPTION OF THE DRAWINGS

The foregoing and other aspects and advantages of this invention are explained and described below with reference to the accompanying drawings, in which:

FIG. 1 shows a device comprising a P-type silicon semiconductor substrate coated with a silicon oxide layer.

FIG. 2 shows the device of FIG. 1 after a photoresist mask has been applied thereto with uniformly spaced buried bit line trench openings formed therein with the trench openings through the mask extending back into the page.

FIG. 3 shows the device of FIG. 2 with the mask stripped from the device and the silicon dioxide layer removed and a silicon dioxide, gate oxide layer formed on the surface of substrate.

FIG. 4A shows the device of FIG. 3 after a photoresist mask has been applied thereto with openings formed therethrough extending back into the page for the cell defined by the mask.

FIG. 4B which is a plan view of the device of FIG. 4A looking down upon the mask.

FIG. 5 shows a sectional view of device shown in FIG. 4A after the photoresist mask has been removed.

FIG. 6A shows a sectional view the device of FIG. 5 is after a photoresist mask has been applied over device hereto with openings formed therethrough extending back into the page for the cell defined by the mask.

FIG. 6B which is a plan view of the device of FIG. 6A looking down upon the mask.

FIG. 7 shows the device of FIG. 6 after the mask has been removed with the device prepared for the back end of the line processing to form the protective layers.

DESCRIPTION OF THE PREFERRED EMBODIMENT

FIGS. 1–7 illustrate the process employed in manufacturing a device in accordance with this invention.

Figure 1:
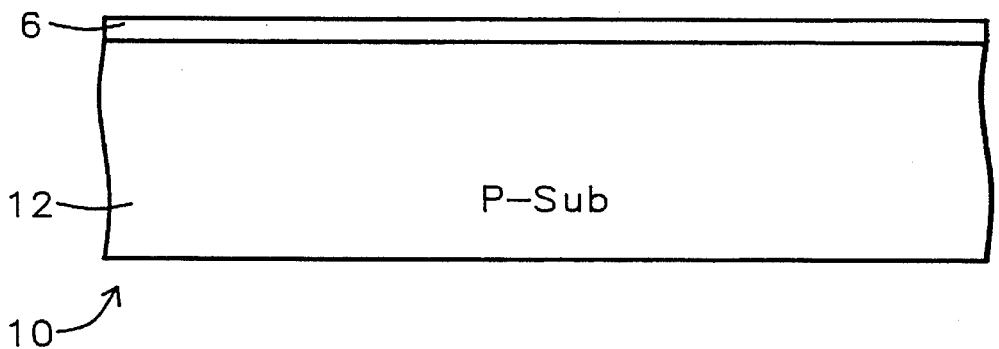
FIGS. 1–3, 4A, 4B, 5, 6A, 6B, and 7 illustrate the process employed in manufacturing a device in accordance with this invention.

FIG. 1 shows a device 10 comprising a P-type silicon semiconductor substrate 12 coated with a silicon oxide layer 6. The substrate is in-situ P-type with a concentration of from about 1 E 15 atoms/cm$^3$ to about 1 E 16 atoms/cm$^3$.

Figure 2:
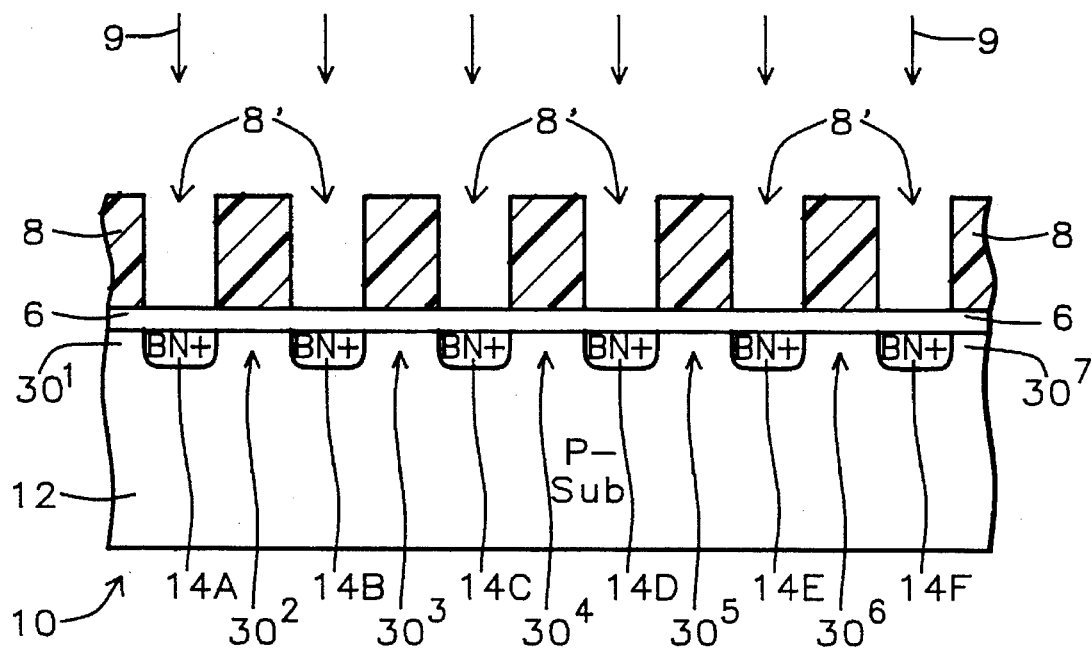

In FIG. 2, the device of FIG. 1 is shown after a photoresist mask 8 has been applied thereto with uniformly spaced buried bit line trench openings 8' formed therein with the trench openings 8' extending back into the page. Then, as shown N+ (arsenic) ions 9 are ion implanted through openings 8' in mask 8 resulting in formation of buried bit line regions 14A, 14B, 14C, 14D, 14E and 14F in the surface of P-doped silicon substrate 12. The buried bit line regions 14A, 14B, 14C, 14D, 14E and 14F extend back into the page leaving slots $30^1$, $30^2$, $30^3$, $30^4$ $30^5$, $30^6$, and $30^7$ as P- doped regions between and/or adjacent to the N+ doped bit line regions 14A, 14B, 14C, 14D, 14E and 14F.

To form buried bit line regions 14A, 14B, 14C, 14D, 14E and 14F, buried arsenic (As) N+ ions can be ion implanted in the P- doped semiconductor substrate 12. For example, arsenic (As) dopant can be implanted with a dosage of from about 1 E 15 ions/cm$^2$ to about 3 E 15 ions/cm$^2$ (preferably 1.5 E 15 ions/cm$^2$) implanted at an energy of from about 70 keV to about 100 keV in an implanter tool. The resulting concentration of N dopant in N+ doped regions 14A, 14B, 14C, 14D, 14E and 14F is present in a concentration level from about 1 E 19 atoms/cm$^3$ to about 1 E 20 atoms/cm$^3$.

Figure 3:
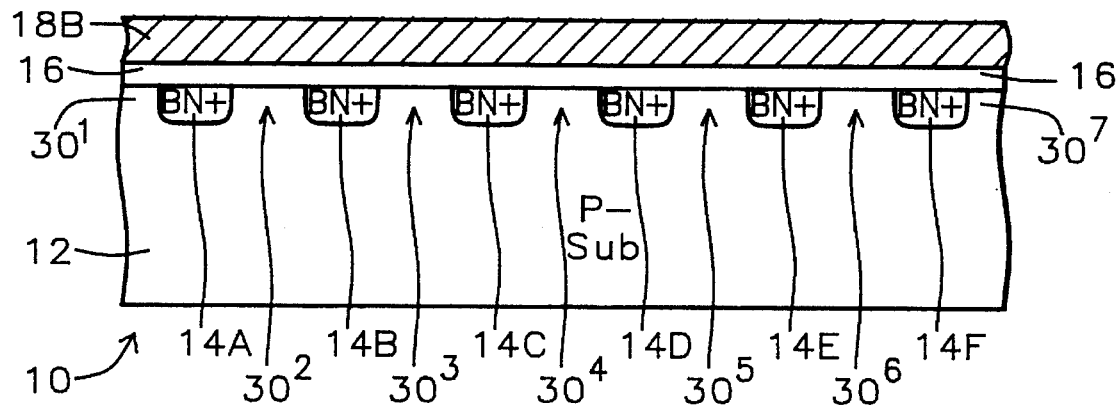

Next, referring to FIG. 3, the device 10 of FIG. 2 is shown with the mask 8 stripped from the device 10 and the silicon dioxide layer 6 is removed and a silicon dioxide, gate oxide layer 16 is formed on the surface of substrate 12 including buried bit line regions 14A, 14B, 14C, 14D, 14E and 14F.

In the preferred embodiment of this invention, there is no FOX formed in the memory cell region because the cell is a flat cell; and there is no specific drive in process for the BN+ regions as the BN+ is anneal by a normal S/D annealing process.

Next, a blanket word line layer composed of doped polysilicon or polycide is formed with a thickness between about 2,000 Å and about 4,000 Å, and the word line layer is patterned into word lines such as word line 18B seen in FIG. 3. The word lines including word line 18B extend at right angles to the buried bit line regions 14A, 14B, 14C, 14D, 14E and 14F in the conventional fashion by applying a mask and etching, as is well understood by those skilled in the art.

Figure 4A:
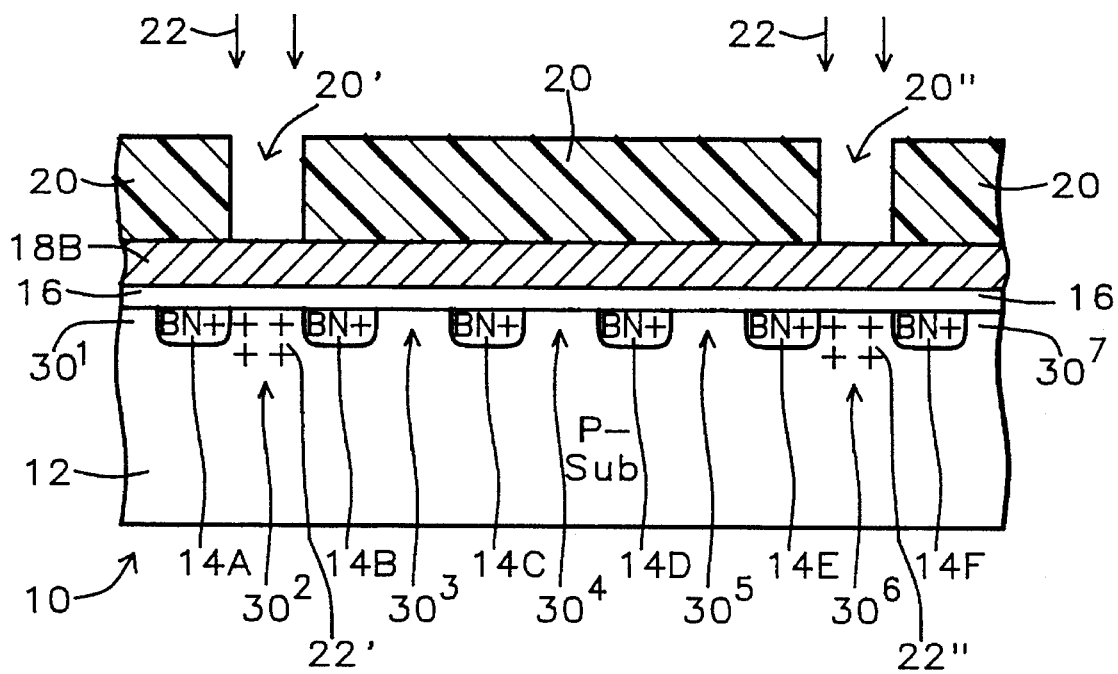
Figure 4B:
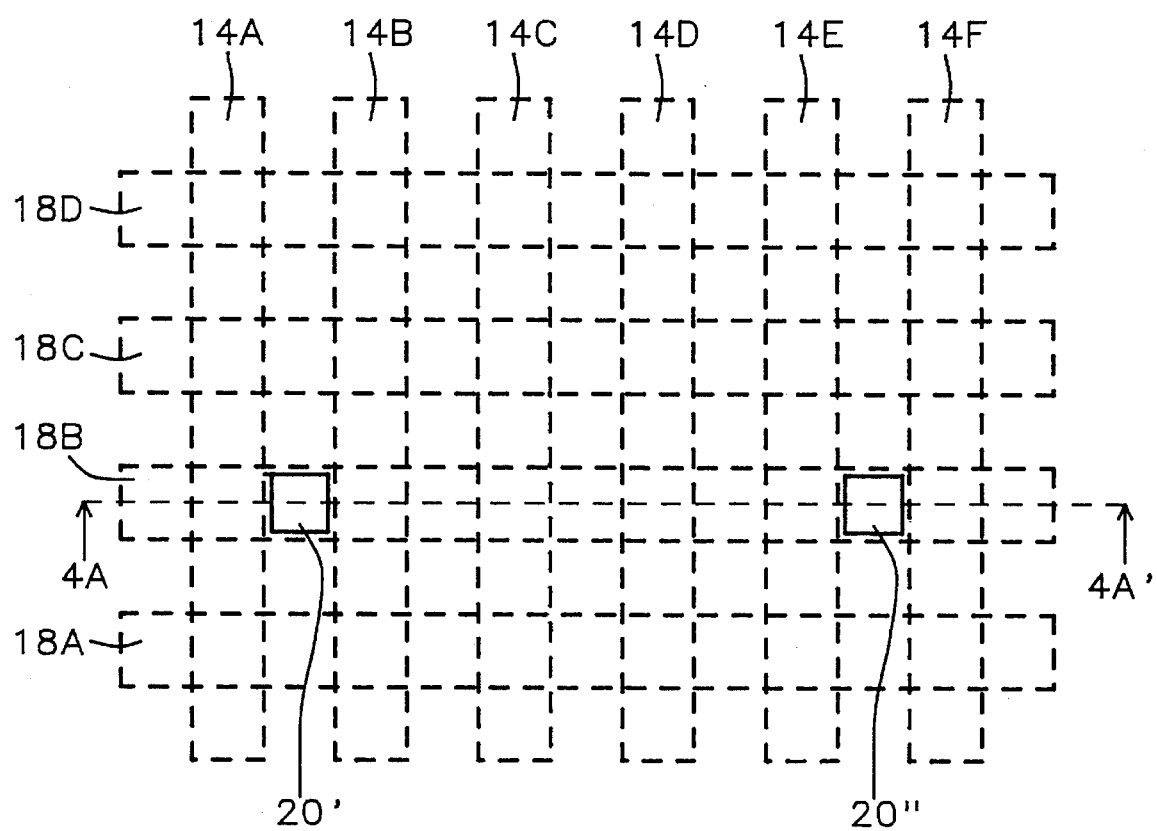

In FIG. 4A, the device of FIG. 3 is shown after a photoresist mask 20 has been applied thereto with openings 20' and 20" formed therethrough extending back into the page for the cell defined by the mask 20 as shown in FIG. 4B which is a plan view of the device of FIG. 4A looking down upon the mask 20 and the word lines 18A, 18B, 18C, and 18D extending from right to left and buried bit lines 14A, 14B, 14C, 14D and 14E extending from top to bottom at right angles to and beneath the word lines 18A, 18B, 18C, and 18D. The location of opening 20' is shown between bit lines 14A and 14B centered over word line 18B and opening 20" is shown between bit lines 14E and 14F also centered over word line 18B.

Then, as shown P+ boron (B$^{11}$) ions 22 are ion implanted through openings 20' and 20" in mask 20 resulting in formation of heavily code doped regions 22' and 22" in slots $30^2$ and $30^6$. The boron ions 22 are implanted with a relatively high dosage of from about 1 E 14 ions/cm$^2$ to about 2 E 14 ions/cm$^2$, (preferably 1.6 E 14 ions/cm$^2$) implanted at an energy of from about 120 keV to about 140 keV in an implanter tool. The resulting concentration of heavily code-doped regions 20' and 20" in the slots $30^2$ and $30^6$ is present in a high concentration level from about 1 E 18 atoms/cm$^3$ to about 2 E 18 atoms/cm$^3$.

Figure 5:
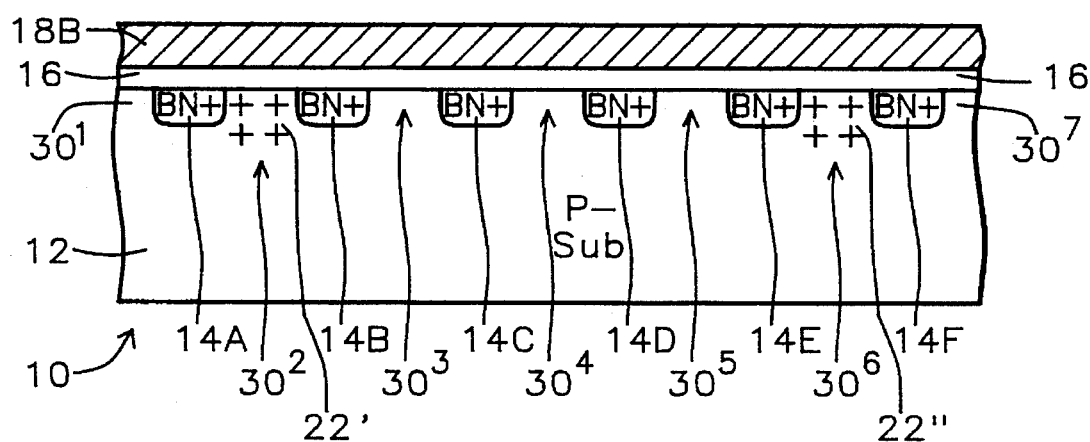

FIG. 5 shows a sectional view of device 10 shown in FIG. 4A after the photoresist mask 20 has been removed.

Figure 6A:
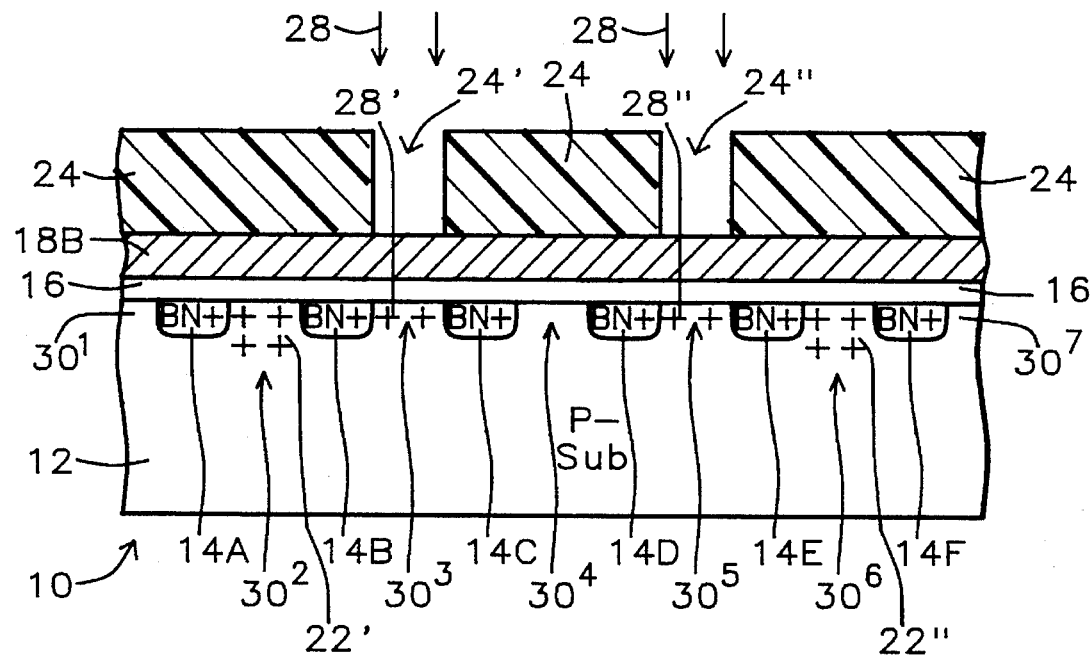
Figure 6B:
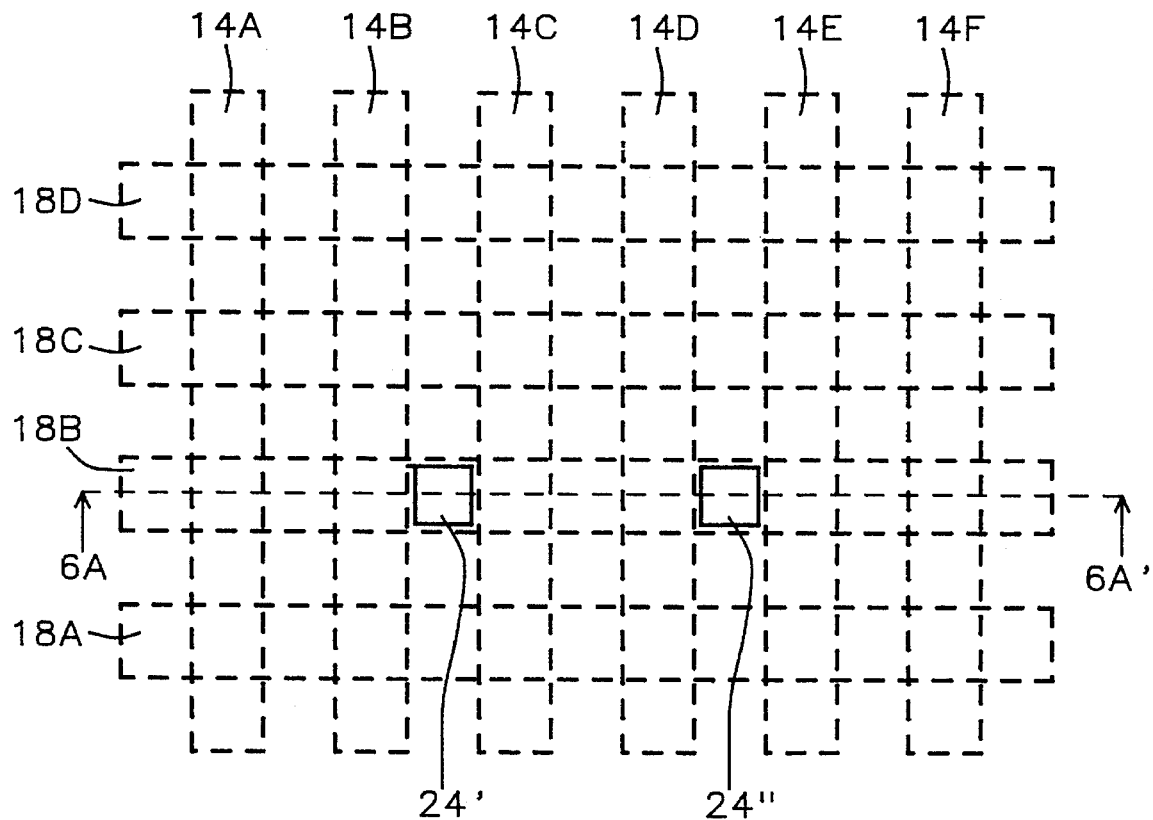

In FIG. 6A, a sectional view the device of FIG. 5 is shown after a photoresist mask 24 has been applied over device hereto with openings 24' and 24" formed therethrough extending back into the page for the cell defined by the mask 24 as shown in FIG. 6B which is a plan view of the device of FIG. 6A looking down upon the mask 20 and the word lines 18A, 18B, 18C, and 18D extending from right to left and buried bit lines 14A, 14B, 14C, 14D and 14E extending from top to bottom at right angles to and beneath the word lines 18A, 18B, 18C, and 18D. The location of opening 24' is shown between bit lines 14B and 14C centered over word line 18B and opening 24" is shown between bit lines 14D and 14E also centered over word line 18B. Then, as shown light code-doped boron (B$^{11}$) ions 28 are ion implanted through openings 24' and 24" in mask 24 resulting in formation of light code-doped regions 28' and 28" in slots $30^3$ and $30^5$. The ions 28 are implanted with a relatively light dosage of from about 2 E 13 ions/cm$^2$ to about 8 E 13 ions/cm$^2$. The dosage of the tri-state is dependent on circuit design. The ions 28 are implanted at an energy of from about 120 keV to about 140 keV in an implanter tool. The resulting concentration is a light dosage concentration from about 1 E 17 atoms/cm$^3$ to about 1 E 18 atoms/cm$^3$ in light code-doped regions 20' and 20" in slots $30^3$ and $30^5$.

Figure 7:
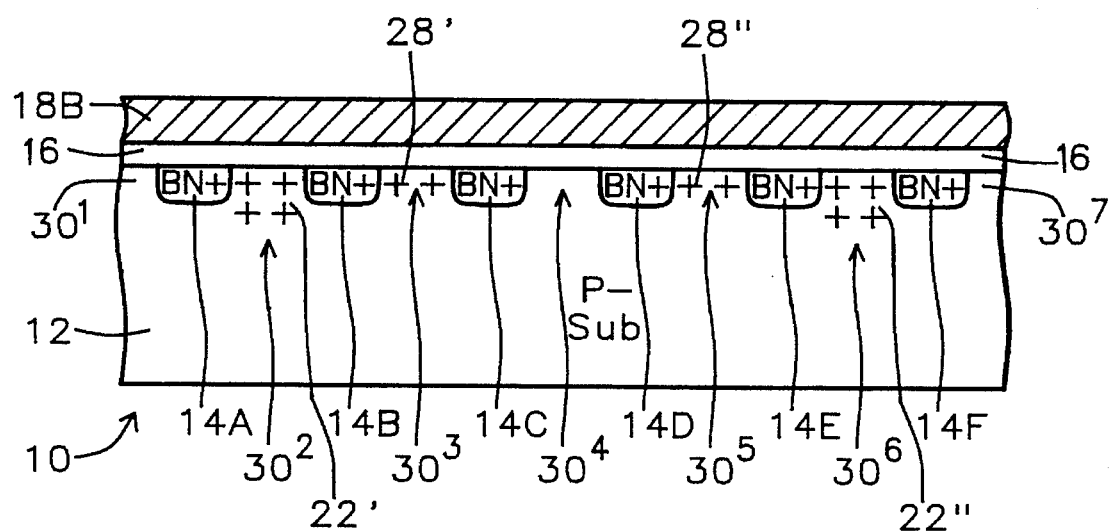

FIG. 7 shows the device 10 of FIG. 6 after the mask 24 has been removed with the device 10 prepared for the back end of the line processing to form the protective layers thereon, as is well known by those skilled in the art.

The slots $30^1$, $30^4$, and $30^7$ remain without and code-doping, so the slots $30^1$, $30^4$, and $30^7$ are in the ON state because the slots $30^1$, $30^4$, and $30^7$ are not doped with boron, $B^{11}$, ions.

The heavily code-doped regions in slots $30^2$, and $30^6$ which were heavily doped, as shown in FIG. 4, are in the OFF state because of the heavy doping.

The lightly code-doped regions in slots $30^3$ and $30^3$ are in the "triple" state intermediate between the ON state no code-doped regions $30^1$, $30^4$ and $30^7$) and the OFF state (heavily code-doped regions $30^2$ and $30^5$.)

In summary, the process of FIGS. 1–7 employs multiple code implantation to form a multiple-state-ROM, (capable of operating in three states. The implications of what is shown is that even more levels of implantation can provide devices capable of operating in multiple (more than three) states.

Figure 8:
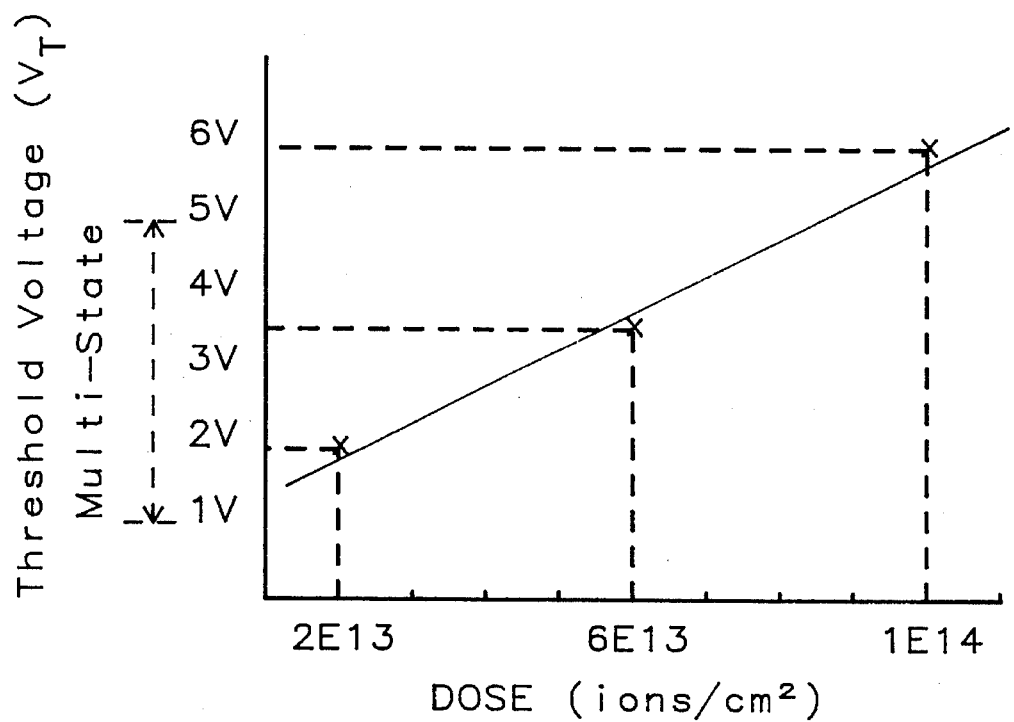
FIG. 8 is a chart showing the cell code threshold voltage $V_T$ has nearly a linear relationship with the code implanted dosage.

FIG. 8 is a chart showing the cell code threshold voltage $V_T$ has nearly a linear relationship with the code implanted dosage. In FIG. 8, the three dosage levels provided in separate sites in the substrate define three different values of cell $V_T$—the cell threshold voltages $V_T$ located within the range between "ON" cell and "OFF" cell $V_T$ (typically 1 V–5 V) one can choose to provide a triple-state or quadruple-state (i.e. multiple-state) device. FIG. 8 is an example of $B^{11}$ used to form code implanted ions with an implanting energy of 130 keV. The data points shown on FIG. 8 are as follows:

| Dose | Voltage |
| --- | --- |
| 2E13 ions/cm$^2$ | 2.0 Volts |
| 6E13 ions/cm$^2$ | 3.7 Volts |
| 1E14 ions/cm$^2$ | 6.0 Volts |

In the same memory density, multiple-state mask ROM can reduce chip size comparison with conventional two-state mask ROM, then cost down can achieve, for example, a triple-state MASK ROM device can save one third of the chip size in comparison with a two-state MASK ROM device.

The process flow of FIGS. 1–7 is a example of a process for manufacture of a triple-state MASK ROM. As stated above, a multiple-state MASK ROM device can be achieved by additional code implantation using additional different dosage levels, as will be well understood by those skilled in the art.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a ROM device on a semiconductor substrate, said substrate including an array of parallel buried bit lines oriented in a first direction, said method comprising the steps as follows:

forming a gate oxide layer over said substrate including said buried bit lines;

forming word lines over said gate oxide layer oriented orthogonally to the first direction of said array of bit lines;

forming a first patterned implant mask over said substrate with a first set of openings through said mask;

ion implanting dopant of a first dosage level through said openings in said mask to form implant doped regions of a first dosage level in channel regions lying in said substrate between said buried bit lines;

forming a second patterned implant mask over said substrate with a second set of openings through said mask; and ion implanting dopant of a second dosage level through said openings in said mask to form implant doped regions of a second dosage level in channel regions lying in said substrate between said buried bit lines, said second dosage level being substantially different from said first dosage level, whereby a multiple state ROM device is provided.

2. The method of claim 1 wherein said first patterned implant dopant comprises $B^{11}$, $BF_2$ or P-type dopant ions implanted at an energy of from about 120 keV to about 140 keV at a dose of from about $1\times10^{14}$ ions/cm$^2$ to about $2\times10^{14}$ ions/cm$^2$.

3. The method of claim 1 wherein said second patterned implant dopant comprises $B^{11}$, $BF_2$ or P-type dopant ions implanted at an energy of from about 120 keV to about 140 keV at a dose of from about $2\times10^{13}$ ions/cm$^2$ to about $8\times10^{13}$ ions/cm$^2$.

4. The method of claim 1 wherein said first patterned implant dopant comprises $B^{11}$, $BF_2$ or P-type dopant ions implanted at an energy of from about 120 keV to about 140 keV at a dose of from about $1\times10^{14}$ ions/cm$^2$ to about $2\times10^{14}$ ions/cm$^2$, and said second patterned implant dopant comprises $B^{11}$, $BF_2$ or P-type dopant ions implanted at an energy of from about 120 keV to about 140 keV at a dose of from about $2\times10^{13}$ ions/cm$^2$ to about $8\times10^{13}$ ions/cm$^2$.

5. The method of claim 1 wherein said first patterned implant provides a dopant concentration from about 1 E 18 atoms/cm$^3$ to about 2 E 18 atoms/cm$^3$.

6. The method of claim 1 wherein said second patterned implant provides a dopant concentration from about 1 E 17 atoms/cm$^3$ to about 1 E 18 atoms/cm$^3$.

7. The method of claim 1 wherein said first patterned implant dopant comprises boron, $B^{11}$, implanted at an energy of from about 120 keV to about 140 key at a dose of from about $1\times10^{14}$ ions/cm$^2$ to about $2\times10^{14}$ ions/cm$^2$, said first patterned implant providing a dopant concentration from about 1 E 18 atoms/cm$^3$ to about 2 E 18 atoms/cm$^3$.

8. The method of claim 1 wherein said second patterned implant dopant comprises boron, $B^{11}$, implanted at an energy of from about 120 keV to about 140 keV at a dose of from about $2\times10^{13}$ ions/cm$^2$ to about $8\times10^{13}$ ions/cm$^2$, said second patterned implant providing a dopant concentration from about 1 E 17 atoms/cm$^3$ to about 1 E 18 atoms/cm$^3$.

9. The method of claim 1 wherein said first patterned implant dopant comprises boron, $B^{11}$, implanted at an energy of from about 120 keV to about 140 keV at a dose of from about $1\times10^{14}$ ions/cm$^2$ to about $2\times10^{14}$ ions/cm$^2$, said first patterned implant providing a dopant concentration from about 1 E 18 atoms/cm$^3$ to about 2 E 18 atoms/cm$^3$, said second patterned implant dopant comprises boron, $B^{11}$, implanted at an energy of from about 120 keV to about 140 keV at a dose of from about $2\times10^{13}$ ions/cm$^2$ to about $8\times10^{13}$ ions/cm$^2$, and said second patterned implant providing a dopant concentration from about 1 E 17 atoms/cm$^3$ to about 1 E 18 atoms/cm$^3$.

10. The method of claim 1 wherein said buried bit lines comprise N+ regions in said substrate.

11. The method of claim 1 wherein said first patterned implant dopant comprises $B^{11}$, $BF_2$ or P-type dopant ions implanted at an energy of from about 120 keV to about 140 keV at a dose of from about $1 \times 10^{14}$ ions/cm$^2$ to about $2 \times 10^{14}$ ions/cm$^2$, and said buried bit lines comprise N+ regions in said substrate.

12. The method of claim 1 wherein said second patterned implant dopant comprises $B^{11}$, $BF_2$ or P-type dopant ions implanted at an energy of from about 120 keV to about 140 keV at a dose of from about $2 \times 10^{13}$ ions/cm$^2$ to about $8 \times 10^{13}$ ions/cm$^2$, and said buried bit lines comprise N+ regions in said substrate.

13. The method of claim 1 wherein said first patterned implant dopant comprises $B^{11}$, $BF_2$ or P-type dopant ions implanted at an energy of from about 120 keV to about 140 keV at a dose of from about $1 \times 10^{14}$ ions/cm$^2$ to about $2 \times 10^{14}$ ions/cm$^2$, and said second patterned implant dopant comprises $B^{11}$, $BF_2$ or P-type dopant ions implanted at an energy of from about 120 keV to about 140 keV at a dose of from about $2 \times 10^{13}$ ions/cm$^2$ to about $8 \times 10^{13}$ ions/cm$^2$, and said buried bit lines comprise N+ regions in said substrate.

14. A method of manufacturing a ROM device on a semiconductor substrate, said substrate including an array of parallel buried bit lines oriented in a first direction, said method comprising the steps as follows:

forming a gate oxide layer over said substrate including said buried bit lines;

forming word lines over said gate oxide layer so that said word lines cross above said array of bit lines;

forming a first patterned implant mask over said substrate with a first set of openings through said mask;

ion implanting dopant through said openings in said mask to form first implant doped regions of a first dosage level in channel regions lying in said substrate between said buried bit lines;

forming a second patterned implant mask over said substrate with a second set of openings through said mask; and ion implanting dopant through said openings in said mask to form second implant doped regions of a second dosage level in channel regions lying in said substrate between said buried bit lines, said second dosage level being substantially different from said first dosage level, whereby a multiple state ROM device is provided.

15. The method of claim 14, wherein said first and said second implant doped regions are formed by implanting impurities at least partially beneath said word lines.

* * * * *